United States Patent
Jove et al.

(10) Patent No.: US 6,265,905 B1
(45) Date of Patent: Jul. 24, 2001

(54) QUASI-VOLTAGE SENSING INPUT IMPEDANCE CONTROLLED PREAMPLIFIER FOR MAGNETORESISTIVE ELEMENTS

(75) Inventors: Stephen Alan Jove, Watsonville; Paul Wingshing Chung, San Jose, both of CA (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/300,653

(22) Filed: Apr. 27, 1999

(51) Int. Cl.⁷ ................................................ H03F 3/45
(52) U.S. Cl. .......................... 327/51; 327/178; 327/179
(58) Field of Search ................................. 327/278, 279, 327/282, 179, 178, 560, 50, 51, 52, 77, 78, 88, 89; 360/67

(56) References Cited

U.S. PATENT DOCUMENTS

| | | | |
|---|---|---|---|
| 4,223,274 | 9/1980 | Paulke et al. | 330/133 |
| 4,510,460 | 4/1985 | Tamura | 330/285 |
| 4,816,772 | 3/1989 | Klotz | 330/254 |
| 5,442,321 | 8/1995 | Bayruns et al. | 330/282 |
| 5,559,460 | * 9/1996 | Cunningham | 327/179 |
| 5,757,230 | 5/1998 | Mangelsdorf | 330/133 |
| 5,859,739 | * 1/1999 | Cunningham et al. | 360/67 |

* cited by examiner

*Primary Examiner*—Tuan T. Lam
*Assistant Examiner*—Hiep Nguyen
(74) *Attorney, Agent, or Firm*—Sawyer Law Group LLP; Randall J. Bluestone (57) ABSTRACT

A method and system for providing a voltage-sensing preamplifier for use with a magnetoresistive sensor is disclosed. The method includes providing a gain stage and providing a control circuit. The system includes the gain stage and the control circuit. The gain stage includes at least one input device that is coupled with the magnetoresistive sensor through an interconnect having a characteristic impedance. The at least one input device has a first input impedance. The control circuit provides at least one signal to the at least one input device. The at least one signal controls the first input impedance of the at least one input device to control a second input impedance of the voltage-sensing preamplifier, such that the preamplifier input impedance is modified toward the characteristic impedance of the interconnect to improve the bandwidth of the signal amplified by the system.

18 Claims, 7 Drawing Sheets

QUASI-VOLTAGE SENSING INPUT IMPEDANCE CONTROLLED PREAMPLIFIER FOR MAGNETORESISTIVE ELEMENTS

CROSS-REFERENCE TO RELATED APPLICATIONS

The present application is related to U.S. patent application Ser. No. 09/300,564, entitled "A Quasi-Current Sensing Input Impedance Controlled Preamplifier for Magnetoresistive Elements," filed on the same day and assigned to same Assignee as the present application.

FIELD OF THE INVENTION

The present invention relates to signal processing in a data storage device and more particularly to a method and system for providing a quasi-voltage sensing preamplifier having controlled input impedance.

BACKGROUND OF THE INVENTION

Magnetic recording media, such as disks are widely used for storing data. In order to write to or read form such recording media, storage devices such as disk drives are typically used. Storage devices typically include heads for reading from and/or writing to the recording media. A head is typically attached to a slider, which holds the head above the recording media. The slider is attached to a suspension, which supports the slider above the recording media. The slider is coupled to an actuator arm which moves the head, slider, and suspension across the recording media.

Currently magnetoresistive (MR) heads are increasingly popular for use in read heads. A MR head includes a MR sensor, which has a resistance that varies with an applied magnetic field. The MR sensor may be an anisotropic magnetoresistance (AMR) sensor or a giant magnetoresistance (GMR) sensor. In order to use the MR sensor, The MR sensor is coupled with electronics, which drive the MR sensor and read the signal from the MR sensor. The electronics are coupled with the MR sensor using a wire interconnect.

The signal from the MR sensor can be read by sensing the voltage across the MR sensor. In order to do so, a conventional voltage-sensing preamplifier (conventional VS preamplifier) is used. Typically, an input of the conventional VS preamplifier is coupled with the interconnect. Voltage from the interconnect is provided to input devices in the conventional VS and amplified by a gain stage in the conventional VS. The input devices typically include transistors. The amplified signal is then provided either as a single ended or differential signal to the remainder of the electronics.

Although the combination of the MR sensor, the interconnect, and the conventional VS preamplifier is capable of reading data on recording media, one of ordinary skill in the art will readily recognize that the ability of the storage device to read at higher data rates is limited. Previously, limitations in the bandwidth of the storage device were due to other portions of the electronics. However, improvements in other portions of the electronics have increased the bandwidths of these components of the storage device. As a result, the bandwidth for the storage device has increased. As the data rate increased, the interface between the MR sensor, the interconnect, and the conventional VS preamplifier has become of increasing importance in constraining the bandwidth of the storage device. In particular, the useful bandwidth of the conventional VS preamplifier as used in the storage device is limited. Thus, the ability of the storage device to read at higher data rates is also limited.

Conventional methods for addressing the limited bandwidth of the conventional VS preamplifier also have drawbacks. One reason for the limited bandwidth of the conventional VS preamplifier is the impedance mismatch between the MR sensor, a characteristic impedance of the interconnect, and the input impedance of the conventional VS preamplifier. The MR sensor has a resistance which can vary on the order of two or three to one. The interconnect typically has a relatively low characteristic impedance, generally on the order of fifty ohms. The characteristic impedance of the interconnect also changes. Different heads may be used in the storage device. These heads occupy different positions within the storage device. In order to reach these heads, the interconnects may have different lengths or shapes. Furthermore, the interconnect typically twists and bends during use, thereby changing the characteristic impedance of the interconnect. The conventional VS preamplifier has a very high input impedance, much more than the characteristic impedance of the interconnect. Thus, the input impedance of the conventional VS preamplifier does not match the characteristic impedance of the interconnect.

In the conventional VS preamplifiers the mismatch between the impedances of MR sensor, the characteristic impedance of the interconnect, and the input of the conventional VS preamplifier is partially addressed by providing a resistor coupled with input devices of the conventional VS preamplifier. The resistor is coupled in parallel with the bases of the transistors used as the input devices. This lowers the input impedance of the conventional VS preamplifier. However, one of ordinary skill in the art will readily recognize that the resistor causes increased signal attenuation, which is undesirable. Consequently, such a method may not be desirable in the conventional VS preamplifier.

Accordingly, what is needed is a system and method for improving the bandwidth of the conventional VS preamplifier and, therefore, the data rate for the storage device. The present invention addresses such a need.

SUMMARY OF THE INVENTION

The present invention provides a method and system for providing a voltage-sensing preamplifier for use with a magnetoresistive sensor. The method comprises providing a gain stage and providing a control circuit coupled with the gain stage. In a system aspect, the present invention includes a gain stage and a control circuit. The gain stage includes at least one input device that is coupled with the magnetoresistive sensor. The at least one input device has a first input impedance. The control circuit is coupled to the at least one input device of the gain stage. The control circuit provides at least one signal to the at least one input device. The at least one one signal controls the first input impedance of the at least one one input device to control a second input impedance of the voltage-sensing preamplifier.

According to the system and method disclosed herein, the present invention provides a voltage-sensing preamplifier having a controllable input impedance. The input impedance of the voltage-sensing preamplifier can, therefore, be substantially matched to a desired valued. For example, the input impedance of the voltage-sensing preamplifier can be substantially matched to a characteristic impedance of an interconnect. Similarly, the input impedance of the voltage-sensing preamplifier can be controlled to be close enough to the characteristic impedance of the interconnect that bandwidth requirements can be satisfied. Thus, the operational bandwidth of the voltage-sensing preamplifier can be increased, allowing for greater ability to read the magnetoresistive sensor at higher data rates.

DETAILED DESCRIPTION OF THE INVENTION

The present invention relates to an improvement in voltage-sensing preamplifier used in reading magnetoresistive (MR) sensors. The following description is presented to enable one of ordinary skill in the art to make and use the invention and is provided in the context of a patent application and its requirements. Various modifications to the preferred embodiment will be readily apparent to those skilled in the art and the generic principles herein may be applied to other embodiments. Thus, the present invention is not intended to be limited to the embodiment shown, but is to be accorded the widest scope consistent with the principles and features described herein.

The present invention provides a method and system for providing a voltage-sensing preamplifier for use with a magnetoresistive sensor. The method comprises providing a gain stage and providing a control circuit coupled with the gain stage. In a system aspect, the present invention includes a gain stage and a control circuit. The gain stage includes at least one input device that is coupled with the magnetoresistive sensor. The at least one input device has a first input impedance. The control circuit is coupled to the at least one input device of the gain stage. The control circuit provides at least one signal to the at least one input device. The at least one signal controls the first input impedance of the at least one input device to control a second input impedance of the voltage-sensing preamplifier.

The present invention will be described in terms of particular voltage-sensing preamplifiers having particular components. However, one of ordinary skill in the art will readily recognize that this method and system will operate effectively for other components in the voltage-sensing preamplifier. For example, although particular embodiments are described, either a single ended or a differential quasi voltage-sensing preamplifier may be provided. Similarly, the embodiments disclosed includes gain stages which operate similarly for a particular quasi voltage-sensing preamplifier. However, nothing prevents each gain stage in a particular quasi voltage-sensing preamplifier from operating differently. For example, a first gain stage of a quasi voltage-sensing preamplifier may operate using principles disclosed with respect to the first embodiment of a voltage-sensing preamplifier in accordance with the present invention. A second gain stage of the same quasi voltage-sensing preamplifier may operate using principles discussed with respect to a second embodiment of a voltage sensing preamplifier in accordance with the present invention. Similarly, controlling the gain in the second gain stage is disclosed in the context of shifting a signal in a particular direction and a particular response of a current source to the shift. However, nothing prevents control of the current source and the second gain stage in another manner. The present invention will also be discussed in the context of matching impedances. However, in the context of the present application, the impedances may be considered matched when they are not exactly identical. The impedances may also be considered matched when they are at least optimized and assume levels for which bandwidth requirements are met.

Figure 1:
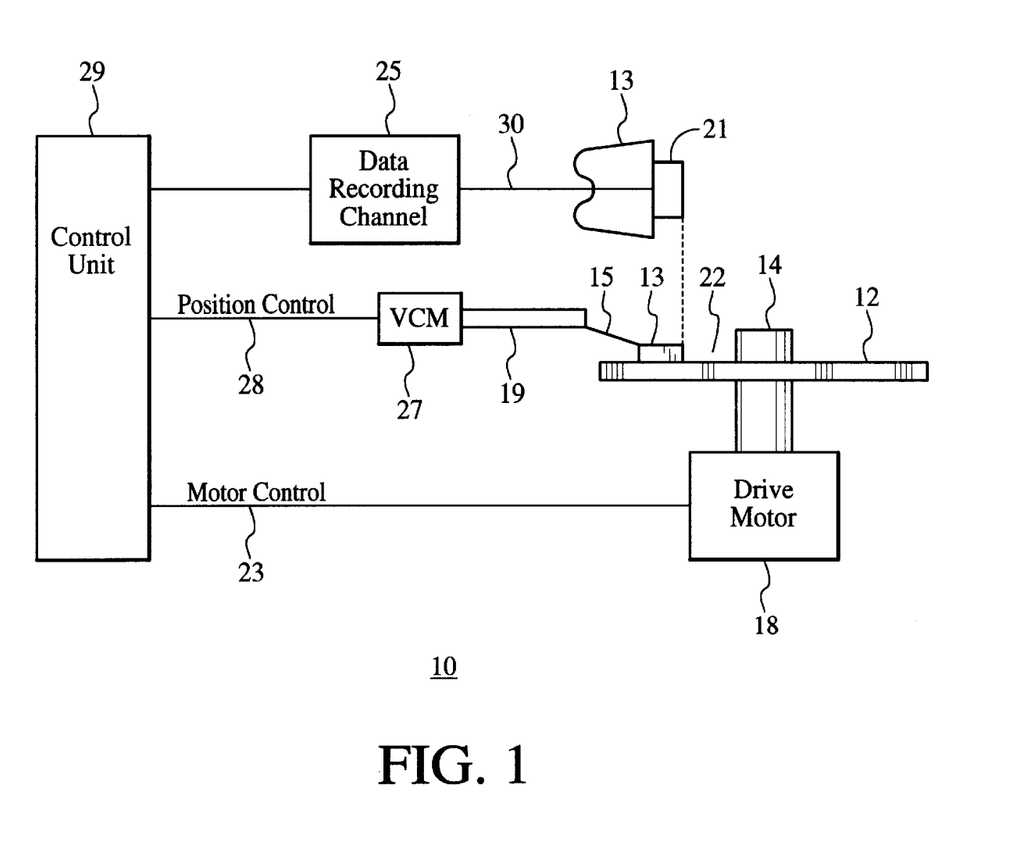
FIG. 1 is a block diagram of a storage device in which the present invention is utilized

To more particularly illustrate the method and system in accordance with the present invention, refer now to FIG. 1, depicting a block diagram of a storage device 10 in which the present invention may be used. The storage device 10 shown is a disk drive. The disk drive 10 reads from and writes to at least one disk 12, which is supported on a spindle 14 and rotated by a disk drive motor 18. The disk 12 includes recording media on a surface 22 of the disk, which may be written to or read from using the disk drive 10.

The disk drive 10 also includes slider 13 that is shown positioned in proximity to the disk 12. Although only one slider 13 is shown, there may be multiple sliders used by the disk drive 10. The slider 13 supports one or more magnetic read heads and/or write heads. Note that a read head and a write head may be combined into a single head. The slider 13 is coupled to a suspension 15 that supports the slider 13.

The suspension 15 is coupled to an arm 19 which supports the suspension 15 and moves the suspension 15 and head across the surface 22 of the disk 12. The arm 19 is coupled with an actuator, depicted as a voice coil motor (VCM) 27 in FIG. 1. Based on a position control signal supplied from a control unit 29 via the line 28, the VCM 27 moves the actuator arm 19. This allows the actuator arm 19 to move the suspension 15 and, therefore, the slider 13 across the surface 22 of the disk 12.

Also depicted in FIG. 1 is the head 21, attached to the slider 13. Components (not depicted in FIG. 1) on the head 21 read from and write to the recording media on the surface 22 of the disk 12. In addition to providing the position control signal, the control unit 29 controls other operations of the disk drive 10. For example, read and write signals are provided to and from the head 21 via the data recording channel 25. The data recording channel 25 includes electronics, not explicitly shown in FIG. 1, for reading signals from the head 21 and controlling the position of the head 21 relative to the disk 12. The data recording channel 25 is electrically coupled with the head through an interconnect 30. The interconnect 30 typically includes wires for providing electrical signals to and from the head 21.

Figure 2:
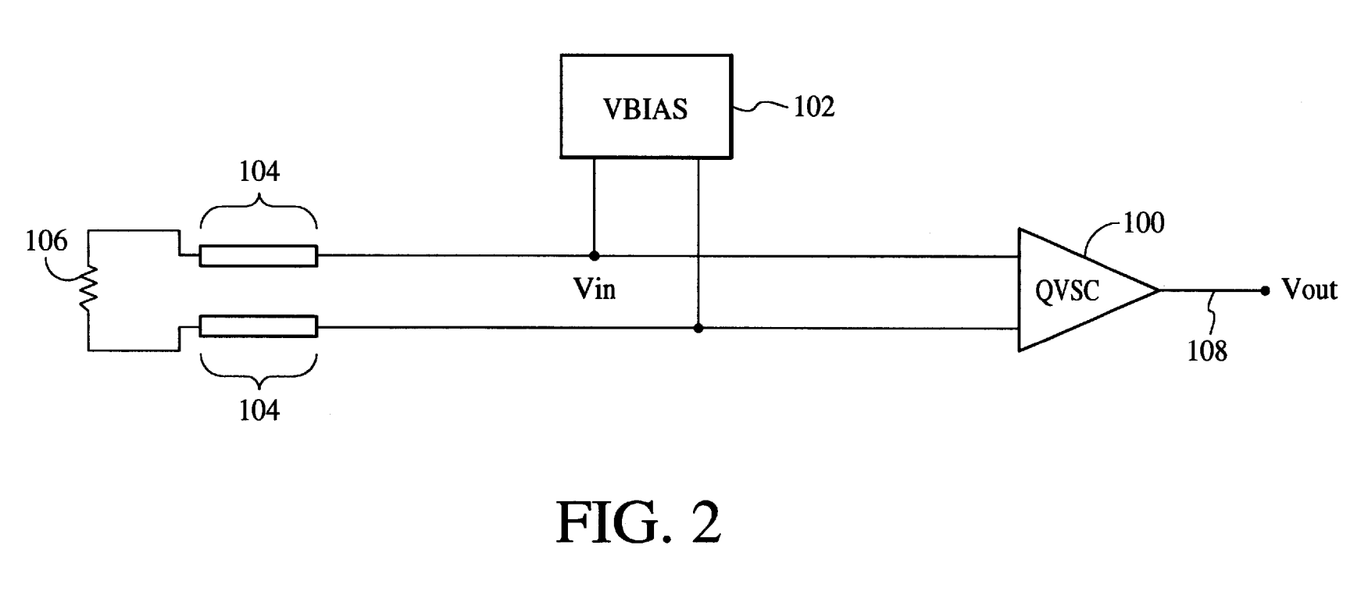
FIG. 2 is a high level block diagram of a quasi voltage-sensing controlled impedance preamplifier in accordance with the present invention as used for reading a magnetoresistance sensor.

FIG. 2 depicts a high-level block diagram of a quasi voltage-sensing controlled input impedance (QVSC) preamplifier 100 in accordance with the present invention. The QVSC preamplifier 100 is termed a "quasi voltage-sensing" because the input impedance of the QVSC preamplifier 100 is less than infinity. The QVSC preamplifier 100 is used in conjunction with a magnetoresistive (MR) sensor 106. The MR sensor 106 is located in the head 21 and coupled with the QVSC preamplifier 100 via an interconnect 104. The interconnect 104 corresponds to the interconnect 13 depicted in FIG. 1. The MR sensor 106 is biased by an MR sensor bias, depicted as a voltage bias 102 in FIG. 1. The voltage bias 102 allows the MR sensor to read the changes in the magnetic field of the recording media on the surface 22 of the disk 12. The voltage bias 102 can be optionally incorporated into the QVSC preamplifier 100. In addition, the MR sensor 106 could be either current biased or voltage biased.

The MR sensor 106 provides a read signal based on the magnetic field generated by the recording media on the surface 22 of the disk 12. This is accomplished by causing a voltage bias by means of controlled currents such that the impedance of the voltage bias 102 seen by the MR sensor 106 approximates infinity. In other words, the voltage bias 102 is a very high input impedance as compared to the input impedance of the QVSC preamplifier 100. The QVSC preamplifier 100 accepts the read signal provided through the interconnect 104, amplifies the read signal, and outputs the amplified read signal over output line 108. Furthermore, the QVSC preamplifier 100 controls its own input impedance. The QVSC preamplifier 100 can match its input impedance to the characteristic impedance of the interconnect 104. As a result, the bandwidth of the system 10 using the QVSC preamplifier 100 can be increased.

Figure 3A:
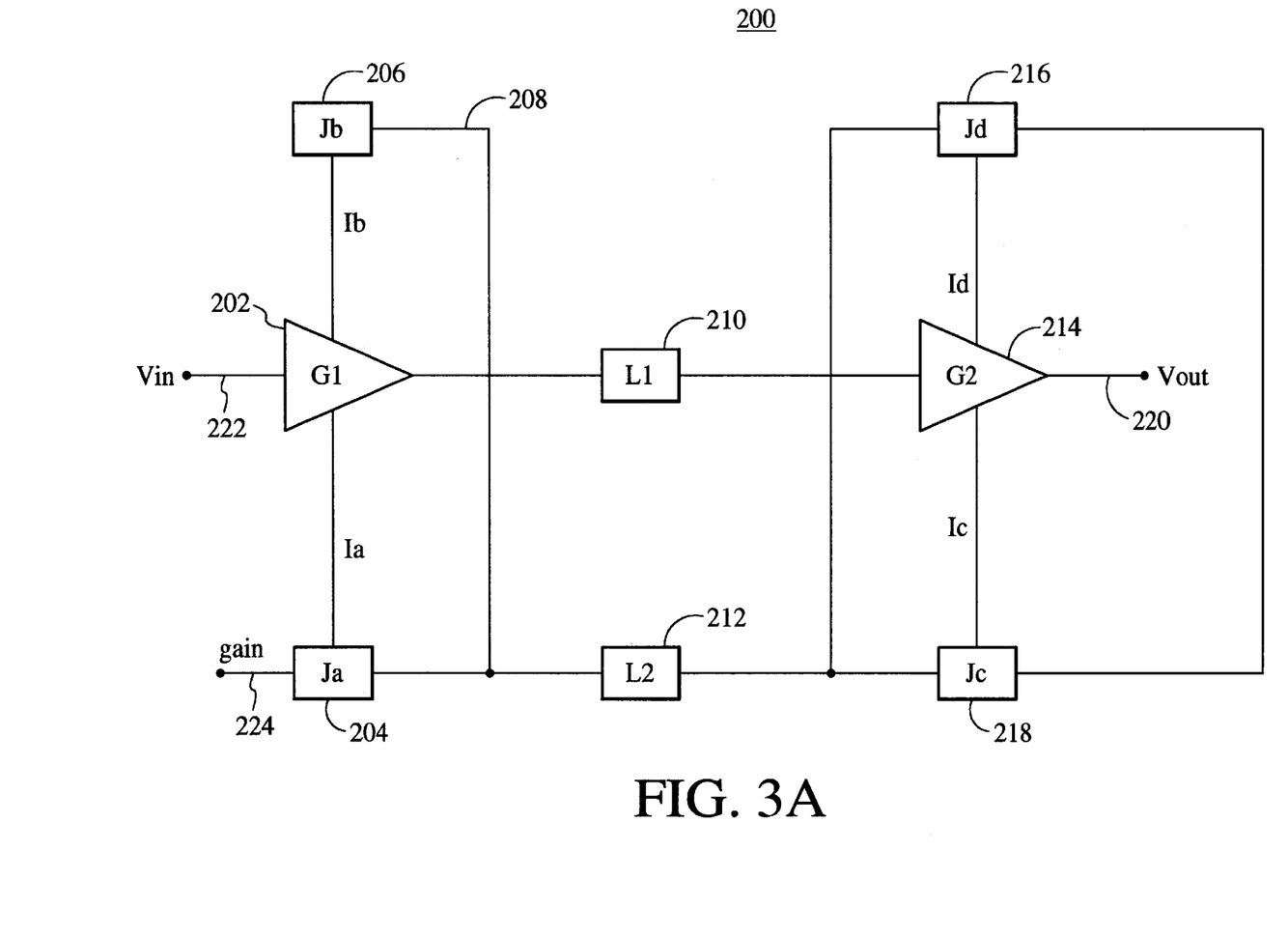
FIG. 3A is a diagram of a first embodiment of a quasi voltage-sensing controlled impedance preamplifier in accordance with the present invention as used for reading a magnetoresistance sensor.

FIG. 3A depicts a first embodiment 200 of the QVSC preamplifier 100 shown in FIG. 2. Referring back to FIG. 3A, the QVSC preamplifier 200 includes a first gain stage 202, a first current source 204, a second current source 206, level-shifting interface stages 210 and 212, a second gain stage 214, a third current source 216, and a fourth current source 218. The read signal is provided from the interconnect 104 (not shown in FIG. 3A) over input line 222. The amplified read signal is output over line 220. In order to provide the output, an intermediate output is provided by the first gain stage 202. The intermediate output is the read signal amplified by the gain of the first gain stage 202. The intermediate output is provided to the second gain stage 214 via level-shifting interface stage 210. The second gain stage 214 amplifies the intermediate output by the gain of the second gain stage 214 and provides the output over line 220. Thus, the QVSC preamplifier 200 can amplify the read signal from the MR sensor 106 to provide the output.

The input impedance of the QVSC preamplifier 200 is controlled by controlling a bias current, $I_a$, provided to the first gain stage 202. The first gain stage 202 includes input device(s), not shown. The input device(s) typically include one or more transistors. The first current source 204 provides the bias current to the input devices of the first gain stage 202. The first current source 204 is controlled by a gain signal provided over the line 224. The gain signal controls the gain of the first gain stage 202 by controlling the bias current of the first gain stage 202. The second current source 206 provides a compensation current, $I_b$, to the first gain stage 202. In order to determine the compensation current, a measure of the output of the first current source 204 is fed to the second current source 206, via the line 208. Thus, the compensation current can thus be made to be substantially equivalent to the bias current provided by the first current source 204.

Because of the compensation current, the first gain stage 202 can be internally biased at predetermined voltage levels even though the bias current ($I_a$) changes. However, the current levels within the first gain stage 202 change when the bias current changes. As a result, the input impedance of the input device(s) of the first gain stage 202 changes. The input impedance, Z, of a bipolar input device is given by:

$Z = V_t/I_{bias}$, where $V_t$=thermal voltage $I_{bias}$=current used to bias the transistor Thus, the input impedance of the input devices changes when the bias current changes.

The input impedance of the first gain stage 202 and, therefore, the input impedance of the QVSC preamplifier 200 is dominated by the input impedance of the input devices. Thus, the input impedance of the QVSC preamplifier 200 changes with changes in the bias current. Increasing the bias current decreases the input impedance of the QVSC preamplifier 200, while decreasing the bias current increases the input impedance of the QVSC preamplifier 200.

Although changing the bias current allows the input impedance to be controlled, changing the bias current also alters the gain of the first stage 202. In order to provide the same gain in the QVSC preamplifier 200, a second gain stage 214 may be used. The gain of the second gain stage 214 is controlled so that the total gain of the QVSC preamplifier 200 remains substantially the same. Thus, as the gain of the first gain stage 202 increases, the gain of the second gain stage 214 decreases. As the gain of the first gain stage 202 decreases, the gain of the second gain stage 214 increases. Consequently, the total gain for the QVSC preamplifier 200 can be made relatively constant.

In the QVSC preamplifier 200 shown in FIG. 3A, the third current source 216 is controlled to control the gain of the second gain stage 214. In order to determine the gain of the second gain stage 214, a measure of the bias current for the first gain stage 202 is fed forward to the second level-shifting interface stage 212. In one embodiment, the measure of the bias current fed to the second level-shifting interface stage 212 is the gain signal provided over line 324. The second level-shifting interface stage 212 shifts up increases in the current from the first current source 204, and vice versa. In response to an increase in the signal from the second level-shifting interface stage 212, the third current source 216 decreases current provided to the second gain stage 214. In response to a decrease in the signal from the second level-shifting interface stage 212, the third current source 216 increases current provided to the second gain stage 214. Thus, the third current source 216 is controlled so that as the current provided by the first current source 204 increases, the current provided by the third current source 216 decreases.

The third current source 216 and the fourth current source 218 function similarly to the first current source 204 and the second current source 206. The third current source controls the gain of the second gain stage 214, as discussed above. The fourth current source 218 provides a compensation current substantially the same as the current provided by the third current source 216. The second gain stage 214 and the first gain stage 202 thus operate in a similar manner. However, the gain of the second gain stage 214 compensates for changes in the gain of the first gain stage 202. Therefore, the gain provided by the QVSC preamplifier 200 to provide the output can be relatively constant. Thus, the input impedance of the QVSC preamplifier 200 can be controlled without substantially affecting the gain of the QVSC preamplifier 200.

Figure 3B:
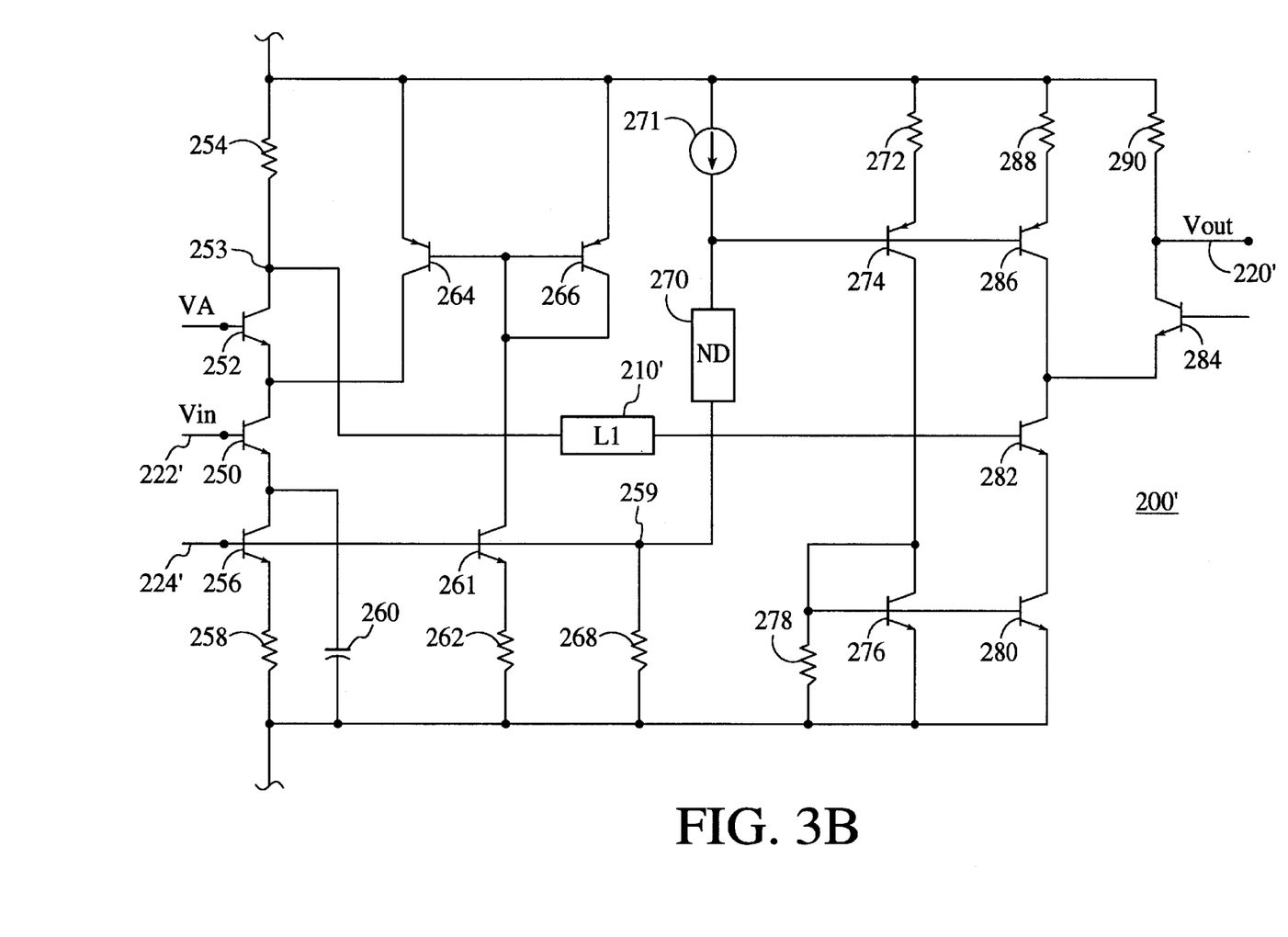
FIG. 3B is a more detailed diagram of the first embodiment of the quasi voltage-sensing controlled impedance preamplifier in accordance with the present invention as used for reading a magnetoresistance sensor.

FIG. 3B depicts a more detailed diagram depicting one embodiment 200' of the first embodiment of the QVSC preamplifier 200. The QVSC preamplifier 200' has components which are analogous to the QVSC preamplifier 200. The QVSC preamplifier 200' receives input from the MR sensor over line 222', receives a gain signal from line 224'. The gain signal controls the gain for a first gain stage that is analogous to the first gain stage 202. The first gain stage of the QVSC preamplifier 200' includes transistor 250, which is an input device, a transistor 252 that acts as a cascode device, a first gain resistor 254, and a decoupling capacitor 260. The first current source of the QVSC preamplifier 200', which is analogous to the first current source 204, includes a transistor 256 and a degeneration resistor 258. The second current source of the QVSC preamplifier 200', which is analogous to the second current source 206, includes transistors 261, 264, and 266, as well as a degeneration resistor 262. The first level-shifting interface stage 210' of the QVSC preamplifier 200' receives an intermediate output from a node 253 in the first gain stage of the QVSC preamplifier 200'. The first level-shifting interface stage 210' provides the intermediate output to the second gain stage of the QVSC preamplifier 200'. The second gain stage of the QVSC preamplifier 200' corresponds to the second gain stage 214 of the QVSC preamplifier 200. The second gain stage of the QVSC preamplifier 200' includes transistors 282 and 284, as well as a gain resistor 290. The QVSC preamplifier 200' provides an output from the second gain stage over the line 220'. The QVSC preamplifier 200' also includes a second level-shifting interface stage, which corresponds to the second level-shifting shifting interface stage 212. The second level-shifting interface stage of the QVSC preamplifier 200' includes a resistor 268, a resistance 270, and a current source 271. The QVSC preamplifier 200' includes a third current source, which corresponds to the third current source 216. The third current source of the QVSC preamplifier 200' includes a degeneration resistor 288 and transistor 286. The fourth current source of the QVSC preamplifier 200', which corresponds to the fourth current source 218, includes transistors 274, 276, and 280, and degeneration resistors 272 and 278.

The current through the input device 250 is controlled to control the input impedance of the QVSC preamplifier 200' in a similar manner to the QVSC preamplifier 200. The input impedance of the input device 250 is controlled by controlling a bias current through the input device 250. The gain signal is fed forward to the node 259 to determine a compensation current as well as the gain of the second stage. As a result, the QVSC preamplifier 200' has a gain which can be substantially constant even though the bias current for the transistor 250 and, therefore, the input impedance of the QVSC preamplifier 200' changes. Thus, the input impedance of the QVSC preamplifier 200' can be controlled without substantially affecting the gain of the QVSC preamplifier 200'.

Figure 4A:
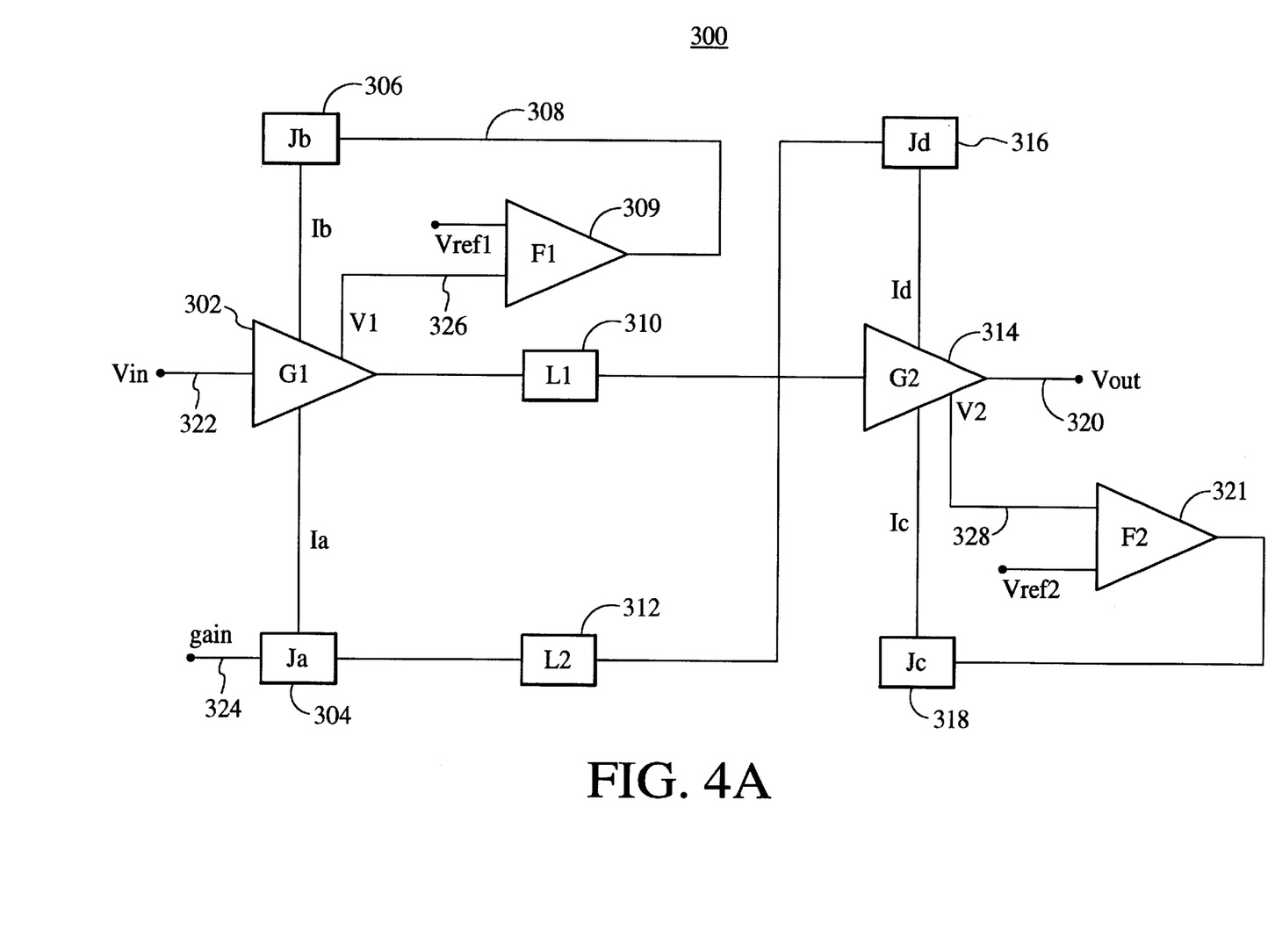
FIG. 4A is a diagram of a second embodiment of a quasi voltage-sensing controlled impedance preamplifier in accordance with the present invention as used for reading a magnetoresistance sensor.

FIG. 4A depicts a second embodiment 300 of the QVSC preamplifier 100 shown in FIG. 2. Referring back to FIG. 4A, the QVSC preamplifier 300 includes a fist gain stage 302, a first current source 304, a second current source 306, level-shifting interface stages 310 and 312, a second gain stage 314, a third current source 316, and a fourth current source 318. The QVSC preamplifier 300 also includes a first operational transconductance amplifier (OTA) 309 and a second OTA 321. The QVSC preamplifier 300 functions similarly to the QVSC preamplifier 200. However, instead of feeding forward a measure of the output of the first current source to control the compensation current of each gain stage, the QVSC preamplifier 300 reads a signal from the gain stage being controlled in a feedback fashion.

A read signal from the MR sensor 106 (not shown in FIG. 4A) is input from the interconnect 104 (not shown in FIG. 4A) using input line 322. The amplified read signal is output over line 320. In order to provide the output, an intermediate output is provided by the first gain stage 302. The intermediate output is the read signal amplified by the gain of the first gain stage 302. The intermediate output is provided to the second gain stage 314 via level-shifting interface stage 310. The second gain stage 314 amplifies the intermediate output by the gain of the second gain stage 314 and provides the output over line 320. Thus, the QVSC preamplifier 300 can amplify the read signal from the MR sensor 106 to provide the output.

The input impedance of the QVSC preamplifier 300 is controlled in a similar manner to the QVSC preamplifier 200 depicted in FIG. 3A. Referring back to FIG. 4A, the first gain stage 302 includes input device(s), not shown. The input device(s) typically include one or more transistors. The first current source 304 provides the bias current to the input devices of the first gain stage 302. The bias current provided by first current source 304 is controlled by a gain signal provided over the line 324. By controlling the bias current, the input impedance of the input device and, therefore, the input impedance of the QVSC preamplifier 300 are controlled.

The second current source 306 provides a compensation current to the first gain stage 302. In order to provide the compensation current, the second current source 306 reads an error signal output by from the first OTA 309. The first OTA 309 includes a stabilizing pole, which is preferably created by a resistance-capacitance network (not shown). Thus, a feedback loop including the lines 308 and 326 and the first OTA 309 is stabilized. The first OTA 309 provides the error signal by amplifying the difference between a signal from the first gain stage 302 received over line 326 and a reference voltage. The signal is preferably a voltage read from a portion of the first gain stage 302. The voltage preferably provides a measure of a current flowing through a gain resistor (not shown) in the first gain stage 302. The error signal is provided over line 308 to control the second current source 306. The error signal controls the second current source 306 such that the compensation current substantially mirrors the bias current provided by the first current source 324. Because of the compensation current, the first gain stage 302 is internally biased at the desired voltage level even though the bias current changes.

For the reasons discussed with respect to the QVSC preamplifier 200, changing the bias current changes the input impedance of the QVSC preamplifier 300. Thus, increasing the bias current decreases the input impedance of the QVSC preamplifier 300. Similarly, decreasing the bias current increases the input impedance of the QVSC preamplifier 300. However, as in the QVSC preamplifier 200, changing the bias current changes the gain of the first gain stage 302 of the QVSC preamplifier 300. In order to provide the same gain in the QVSC preamplifier 300, the second gain stage 314 is used. The gain of the second gain stage 314 is controlled in a similar manner as the gain of the second gain stage 214. Referring back to FIG. 4A, a measure of the bias current for the first gain stage 302 is fed forward to the second level-shifting interface stage 312. In one embodiment, the measure of the bias current for the first gain stage 302 is the gain signal provided over line 324. The second level-shifting interface stage 312 shifts up increases in the current fed forward from the first current source 304, thereby inverting the phase from an increase to a decrease when applied to current source 316, and vice versa. In other words, the third current source 316 decreases current in response to an increase in the signal provided from the second level-shifting shifting interface stage 312. The third current source 316 also increases current in response to a decrease in the signal provided from the second level-shifting interface stage 312. Thus, the third current source 316 is controlled so that as the current provided by the first current source 304 increases, the current provided by the third current source 316 decreases. As a result, the gain of the second gain stage 314 compensates for changes in the gain of the first gain stage. Consequently, the total gain for the QVSC preamplifier 300 remains relatively constant.

The fourth current source 318 provides a compensation current substantially the same as the current provided by the third current source 316. Thus, the second gain stage 314 and the first gain stage 302 thus operate in a similar manner. However, the gain of the second gain stage 314 compensates for changes in the gain of the first gain stage 302. Therefore, the gain provided by the QVSC preamplifier 300 can be relatively constant.

Figure 4B:
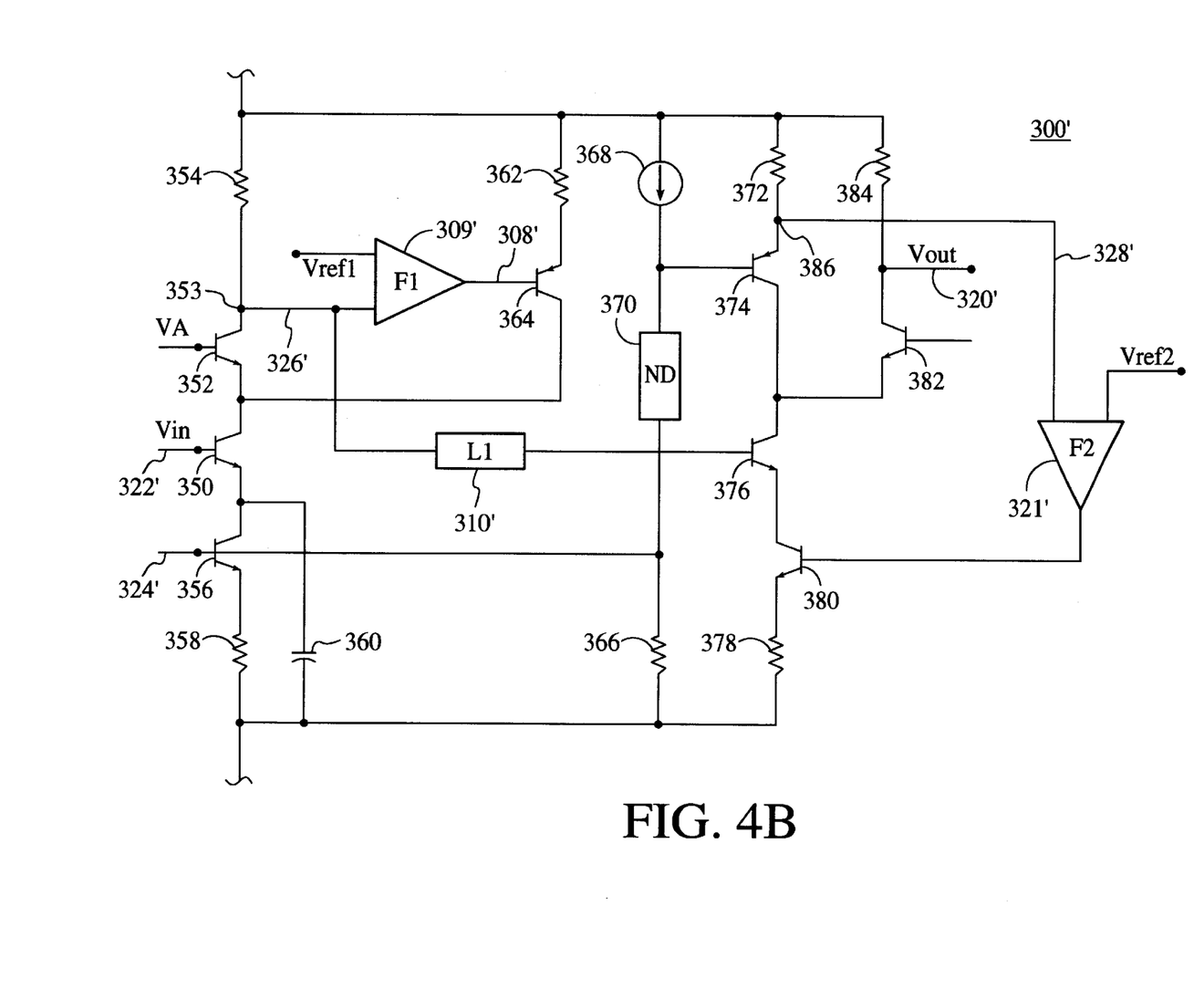
FIG. 4B is a more detailed diagram of the second embodiment of the quasi voltage-sensing controlled impedance preamplifier in accordance with the present invention as used for reading a magnetoresistance sensor.

FIG. 4B depicts a more detailed diagram of one embodiment 300' of the second embodiment of the QVSC preamplifier 300. The QVSC preamplifier 300' has components which are analogous to the QVSC preamplifier 300. The QVSC preamplifier 300' receives input from the MR sensor over line 322', receives a gain signal from line 324'. The gain signal controls the gain for a first gain stage that is analogous to the first gain stage 302. The first gain stage of the QVSC preamplifier 300' includes a transistor 350 that is an input device, a transistor 352 that acts as a cascode device, a gain resistor 354, and a decoupling capacitor 360. The first current source of the QVSC preamplifier 300', which is analogous to the first current source 304, includes transistor 356, and degeneration resistor 358. The second current source of the QVSC preamplifier 300', which is analogous to the second current source 306, includes a transistor 364 and a resistor 362. The second current source of the QVSC preamplifier 300' is controlled by an error signal from the first OTA 309' provided over line 308'. The first OTA 309 provides the error signal which is derived by amplifying the difference between a reference voltage and a voltage from the first gain stage of the QVSC preamplifier 300', read at a node 353. The voltage at the node 353 provides a measure of the current through the gain resistor 354.

The QVSC preamplifier 300 also includes a first level-shifting interface stage 310'. The first level-shifting interface stage 310' accepts a first intermediate output from the node 353 in the first gain stage of the QVSC preamplifier 300'. The first level-shifting interface stage 310' provides a second intermediate output to the second gain stage of the QVSC preamplifier 300', which corresponds to the second gain stage 314 of the QVSC preamplifier 300. The second gain stage of the QVSC preamplifier 300' includes transistors 376 and 382, as well as a gain resistor 384. The QVSC preamplifier 300' provides an output from the second gain stage over the line 320'.

The QVSC preamplifier 300' also includes a second level-shifting interface stage, which corresponds to the second level-shifting stage 312. The second level-shifting interface stage of the QVSC preamplifier 300' includes resistor 366, resistance 370, and current source 368. The QVSC preamplifier also includes a third current source including a resistor 372 and a transistor 374. The fourth current source of the QVSC preamplifier 300', which corresponds to the fourth current source 318, includes transistor 380 and resistor 378. The compensation current provided by the fourth current source of the QVSC preamplifier 300' is controlled by an error signal provided by a second OTA 321'. The second OTA 321' provides the error signal by amplifying the difference between a second reference voltage and a voltage from the second gain stage of the QVSC preamplifier 300'. The voltage is read at a node 386 and provided over the line 328'. The voltage at the node 386 provides a measure of the current through the gain resistor 372.

The current through the input device 350 is controlled to control the input impedance of the QVSC preamplifier 300' in a similar manner to the QVSC preamplifier 300. The input impedance of the input device 350 is controlled by controlling a bias current through the input device 350. A voltage representative of the bias current is provided across the resistor 366 to the second level-shifting interface stage of the QVSC preamplifier 300'. Thus, the gain of the second gain stage of the QVSC preamplifier 300' is controlled to compensate for changes in the gain of the first gain stage of the QVSC preamplifier 300'. As a result, the QVSC preamplifier 300' has a gain which can be substantially constant even though the bias current for the transistor 350 and, therefore, the input impedance of the QVSC preamplifier 300' changes. Thus, the input impedance of the QVSC preamplifier 300' can be controlled without substantially affecting the gain of the QVSC preamplifier 300'.

Figure 5:
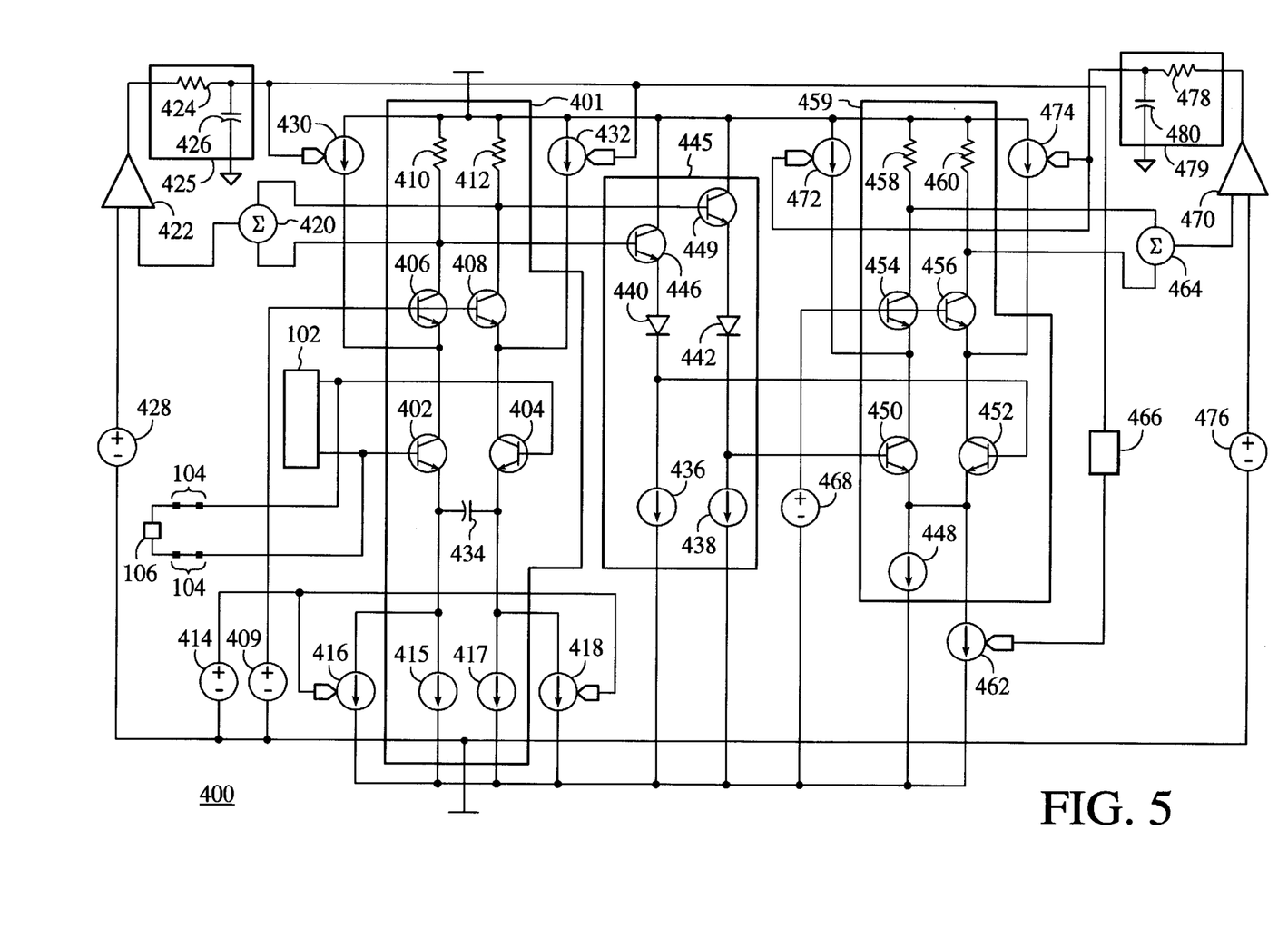
FIG. 5 is a diagram of one embodiment of a differential quasi voltage-sensing controlled impedance preamplifier in accordance with the present invention, as used for reading a magnetoresistance sensor.

FIG. 5 depicts a detailed diagram of one embodiment of a differential QVSC preamplifier 400 in accordance with the present invention. The QVSC preamplifier 400 is depicted as connected with MR sensor 106 using interconnect 104. The QVSC preamplifier 400 includes a first gain stage 401 including input devices 402 and 404, transistors 406 and 408, a bypass capacitor 434, fixed current sources 415 and 417, and resistors 410 and 412. The read signal is provided to input devices 402 and 404, which are bipolar transistors. The transistors 406 and 408 serve as an interface between the input devices 402 and 404 and the resistors 410 and 412. The transistors 406 and 408 also act as cascode devices and are biased by voltage source 409. The fixed current sources 415 and 417 provide a fixed minimum bias current to the input devices 402 and 404. The resistors 410 and 412 act as a first set of gain resistors for the first gain stage 401 of the QVSC preamplifier 400.

The gain of the first gain stage 401 is determined by the gain voltage 414, which can be varied. The gain voltage 414 is provided to controlled current sources 416 and 418. The controlled current sources 416 and 418 can provide additional bias current to the input devices 402 and 404 based on changes in the gain voltage. Increasing the current provided by the controlled current sources 416 and 418 reduces the input impedance of the input devices 402 and 404. Thus, increasing the current provided by the controlled current sources 416 and 418 reduces the input impedance of the QVSC preamplifier 400. Similarly, decreasing the current provided by the controlled current sources 416 and 418 increases the input impedance of the QVSC preamplifier 400. Furthermore, the noise performance of the QVSC preamplifiers 200, 200', 300, 300', and 400 can be modified by changing the gain/input impedance.

In the QVSC preamplifier 400, a compensation current is provided in order to prevent excessive current from flowing in and saturating the first gain stage 401. The QVSC preamplifier 400 utilizes an average current through the transistors 406 and 408. The average current is determined by a summing block 420 from the average output voltage. A first OTA 422 amplifies the difference between the average output voltage and a first reference voltage 428. The output of the OTA 422 is provided to controlled current sources 430 and 432. The controlled current sources 430 and 432 provide a compensation current to the first gain stage 401 of the QVSC preamplifier 400. For stabilization, a first pole 425 that includes resistor 424 and capacitor 426 is included in a feedback loop that includes the OTA 422, the summing block 420, the first pole 425, and the controlled current sources 430 and 432.

Although feedback is used to provide the compensation current in the QVSC preamplifier 400, in an alternate embodiment, the compensation current could be provided by monitoring the currents provided by controlled current sources 416 and 418 and providing equal currents at the emitters of the transistors 406 and 408.

An intermediate output from the first gain stage 401 is provided to a first level-shifting interface stage 445. The first level-shifting interface stage includes transistors 444 and 446, diode strings 440 and 442, and current sources 436 and 438. The first level-shifting interface stage 445 drives a second gain stage 459. The second gain stage 459 includes input devices 450 and 452, current source 448, transistors 454 and 456, and gain resistors 458 and 460. The input devices 450 and 452 are transistors. The transistors 454 and 456 act as cascode devices. The current source provides a constant bias current to the input devices 450 and 452. The second gain stage 459 operates in a similar manner to the first gain stage 401. Thus, a feedback loop including summer 464, a second reference voltage 476, a second OTA 470, a second pole 479, and controlled current sources 472 and 474 is used to provide a compensation current. The second pole 479 includes resistor 478 and capacitor 480.

Changing the input impedance of the QVSC preamplifier 400 also alters the gain of the first gain stage 401. Thus, the gain of the second gain stage 459 is controlled to compensate for changes in the gain of the first gain stage 401. In order to control the gain of the second gain stage 459, the signal from the OTA 422 is used. This signal is applied to current sources 430 and 432 for controlling the compensation current in the first gain stage 401. The signal is also applied to a second level-shifting interface stage 466. The second level-shifting interface stage 466 provides a signal to controlled current source 462. The controlled current source 462 can change the bias current to input devices 450 and 452 and, therefore, can change the gain of the second gain stage 459. The level-shifting stage 466 ensures that increases in the compensation current cause the gain of the second gain stage 459 to increase, and vice versa. Thus, the gain of the second gain stage 459 can be controlled ensure that the gain of the QVSC preamplifier 400 remains substantially constant as the input impedance of the QVSC preamplifier changes.

Because the input impedances of the QVSC preamplifiers 100, 200, 200', 300, 300', and 400 can be controlled, the bandwidths of QVSC preamplifiers 100, 200, 200', 300, 300', and 400 can be improved. The input impedances of the QVSC preamplifiers 100, 200, 200', 300, 300', and 400 can be controlled to match or substantially approach the characteristic impedance of the interconnect 104. Similarly, the input impedance of the QVSC preamplifiers 100, 200, 200', 300, 300' and 400 can be controlled to be close enough to the characteristic impedance of the interconnect to meet bandwidth requirements. Thus, the limitations in the bandwidth due to mismatches between the characteristic impedance of the interconnect and the input impedance of the QVSC preamplifiers 100, 200, 200', 300, 300', and 400 can be reduced or eliminated. The bandwidths of the QVSC preamplifiers 100, 200, 200', 300, 300', and 400 can be extended, allowing for higher data rates in the disk drive 10. Consequently, performances of the QVSC preamplifiers 100, 200, 200', 300, 300', and 400 as well as the disk drive 10 are improved.

A method and system has been disclosed for providing a quasi voltage-sensing controlled input impedance preamplifier that is preferably used in the context of reading a signal from an MR sensor. Although the present invention has been described in accordance with the embodiments shown, one of ordinary skill in the art will readily recognize that there could be variations to the embodiments and those variations would be within the spirit and scope of the present invention. Accordingly, many modifications may be made by one of ordinary skill in the art without departing from the spirit and scope of the appended claims.

What is claimed is:

1. A voltage-sensing preamplifier for use with a magnetoresistive (MR) sensor, the voltage-sensing preamplifier comprising:

a gain stage including at least one input device, the at least one input device having a first input impedance, the at least one input device coupled with the MR sensor; and a control circuit coupled with the at least one input device, the control circuit providing at least one signal to the at least one input device, the at least one signal controlling the first input impedance of the at least one input device and a second input impedance of the voltage-sensing preamplifier, wherein the at least one input device is coupled with the MR sensor through an interconnect having a characteristic impedance and wherein the at least one signal controls the second input impedance of the voltage-sensing preamplifier to substantially match the characteristic impedance of the interconnect.

2. The voltage-sensing preamplifier of claim 1 wherein the gain stage has a first gain, the voltage-sensing preamplifier has a total gain, and wherein the voltage-sensing preamplifier further includes:

a second gain stage coupled with the gain stage, the second gain stage having a second gain;

wherein the total gain of the voltage-sensing preamplifier is the first gain multiplied by the second gain.

3. The voltage-sensing preamplifier of claim 2 wherein the second gain stage compensates for changes in the first gain due to the at least one signal such that the total gain is substantially constant.

4. The voltage-sensing preamplifier of claim 1 wherein the at least one signal changes a bias current of the at least one input device.

5. The voltage-sensing preamplifier of claim 1 wherein the control circuit includes a first current source and a second current source, the first current source providing a bias current to the at least one input device, the bias current controlling the second input impedance of the voltage-sensing preamplifier, and the second current source providing a compensation current to the gain stage, the compensation current being substantially equal to a bias current.

6. The voltage-sensing preamplifier of claim 5 wherein the control circuit feeds forward a measure of the bias current to provide the compensation current.

7. The voltage-sensing preamplifier of claim 5 wherein the control circuit feeds forward a signal in the gain stage to determine the compensation current.

8. The voltage-sensing preamplifier of claim 1 wherein the MR sensor further has a resistance and wherein the at least one signal controls the first input impedance based on the resistance of the MR sensor.

9. A method for controlling a voltage-sensing preamplifier that is used with a magnetoresistive (MR) sensor, the voltage-sensing preamplifier including at least one gain stage and a control circuit, the at least one gain stage including at least one input device having a first input impedance, the at least one input device being coupled with the MR sensor through an interconnect having a characteristic impedance, the method comprising the steps of:

(a) providing at least one signal from the control circuit to the at least one input device;

(b) controlling the at least one signal to control the first input impedance of the at least one input device and a second input impedance of the voltage-sensing preamplifier; and (c) adjusting the second input impedance of the voltage-sensing preamplifier to match substantially the characteristic impedance of the interconnect.

10. The method of claim 9 wherein the at least one gain stage includes a first gain stage and a second gain stage, the first gain stage having a first gain, the second gain stage having a second gain, the voltage-sensing preamplifier having a total gain, and wherein the total gain of the voltage-sensing preamplifier is the first gain multiplied by the second gain.

11. The method of claim 9 further comprising the step of:

(d) compensating for changes in the first gain due to the at least one signal using the second gain stage, wherein the total gain of the voltage-sensing preamplifier is substantially constant.

12. The method of claim 9 wherein the controlling step (b) further includes the step of:

(b1) using the at least one signal to change a bias current of the at least one input device.

13. The method of claim 10, wherein the control circuit includes a first current source and a second current source, the first current source providing a bias current to the at least one input device, the bias current controlling the second input impedance of the voltage-sensing preamplifier, and the second current source providing a compensation current to the at least one gain stage, the compensation current being substantially equal to a bias current.

14. The method of claim 13 wherein controlling step (b) further includes the step of:

(b1) providing a measure of the bias current to the control circuit; and (b2) providing the compensation current based on the measure of bias current.

15. The method of claim 13 wherein controlling step (b) further includes the step (b1) reading an output of the at least one gain stage using the control circuit; and (b2) providing the compensation current based on the reading of the output.

16. The method of claim 10, wherein the MR sensor further has a resistance and wherein the controlling step (b) further includes the step of:

(b1) using the at least one signal to control the second input impedance of the voltage-sensing preamplifier based on the resistance of the MR sensor.

17. A voltage-sensing preamplifier for use with a magnetoresistive (MR) sensor, the voltage-sensing preamplifier comprising:

a gain stage including at least one input device, the at least one input device having an first input impedance, the at least one input device coupled with the MR sensor;

a control circuit coupled with the at least one input device, the control circuit providing at least one signal to the at least one input device, the at least one signal controlling the first input impedance of the at least one input device and a second input impedance of the voltage-sensing preamplifier;

the gain stage including a first gain, the voltage-sensing preamplifier having a total gain, a second gain stage coupled with the gain stage, the second gain stage having a second gain; wherein the total gain of the voltage-sensing preamplifier is the first gain multiplied by the second gain;

wherein the second gain stage compensates for changes in the first gain due to the at least one signal such that the total gain of the voltage-sensing preamplifier is substantially constant.

18. A method for controlling a voltage-sensing preamplifier that is used with a magnetoresistive (MR) sensor, the voltage-sensing preamplifier having a total gain and including at least one gain stage and a control circuit, the at least one gain stage including at least one input device having a first input impedance, the at least one input device being coupled with the MR sensor, the method comprising the steps of:

(a) providing at least one signal from the control circuit to the at least one input device;

(b) controlling the at least one signal to control the first input impedance of the at least one input device and a second input impedance of the voltage-sensing preamplifier; and (c) compensating for changes in the first gain due to the at least one signal using a second gain stage, wherein the total gain of the voltage-sensing preamplifier is substantially constant.

* * * * *